United States Patent
van Essen et al.

[11] 4,125,866
[45] Nov. 14, 1978

[54] NON-RECURSIVE DISCRETE FILTER

[75] Inventors: Hendrik A. van Essen; Petrus J. van Gerwen, both of Eindhoven, Netherlands

[73] Assignee: U.S. Philips Corporation, New York, N.Y.

[21] Appl. No.: 807,168

[22] Filed: Jun. 16, 1977

[30] Foreign Application Priority Data

Jul. 6, 1976 [NL] Netherlands ............... 7607426

[51] Int. Cl.$^2$ .................................... G06F 15/34
[52] U.S. Cl. .................... 364/724; 328/167; 333/18; 333/28 R; 333/70 T
[58] Field of Search ............. 364/724; 333/18, 28 R, 333/70 T; 325/42; 328/165, 167

[56] References Cited

U.S. PATENT DOCUMENTS

| 3,639,848 | 2/1972 | Elliott | 328/167 |
| 3,906,347 | 9/1975 | Motley et al. | 333/18 X |

Primary Examiner—Jerry Smith
Attorney, Agent, or Firm—Frank R. Trifari; Simon L. Cohen

[57] ABSTRACT

A non-recursive discrete filter for simultaneously realizing for example two band-pass filter characteristics starting from a given lowpass transfer characteristic, wherein one bandpass filter has an in-phase transfer characteristic and the other filter the quadrature transfer characteristic of this in-phase filter. The central frequency of these filters is $f_o$ and the output sampling frequency is $f_s = 8f_o$. This discrete filter comprises multiplying means in which input signal samples $x(n)$ are modified by an associated filter coefficient $a(i)$ for generating modified input signal samples $z(n,i) = a(i)x(n-i)$. The coefficients $a(i)$ are the same for both transfer characteristics and are given by:

$$a(i) = h_1(i) \mid \cos(\pi i/4) \mid \quad \text{for } \cos(\pi i/4) \neq 0$$
$$a(i) = h_1(i) \mid \sin(\pi i/4) \mid \quad \text{for } \cos(\pi i/4) = 0$$

wherein $h_1(i)$ represents the discrete impulse response of the lowpass filter.

To realize the in-phase transfer characteristic the samples $z(n,i)$ are thereafter multiplied by a factor sgn[cos$(\pi i/4)$] and the products thus obtained are accumulated. This results in the output signal sample $$y_1(n) = \sum_{i=0}^{N-1} z(n,i) \cdot \text{sgn}[\cos(\pi i/4)]$$

To realize the quadrature transfer characteristic the samples $z(n,i)$ are thereafter multiplied by a factor sgn[sin$(\pi i/4)$] and the products thus obtained are accumulated. This results in the output signal sample $$y_2(n) = \sum_{i=0}^{N-1} z(n \cdot i) \cdot \text{sgn}[\sin(\pi i/4)].$$

1 Claim, 3 Drawing Figures

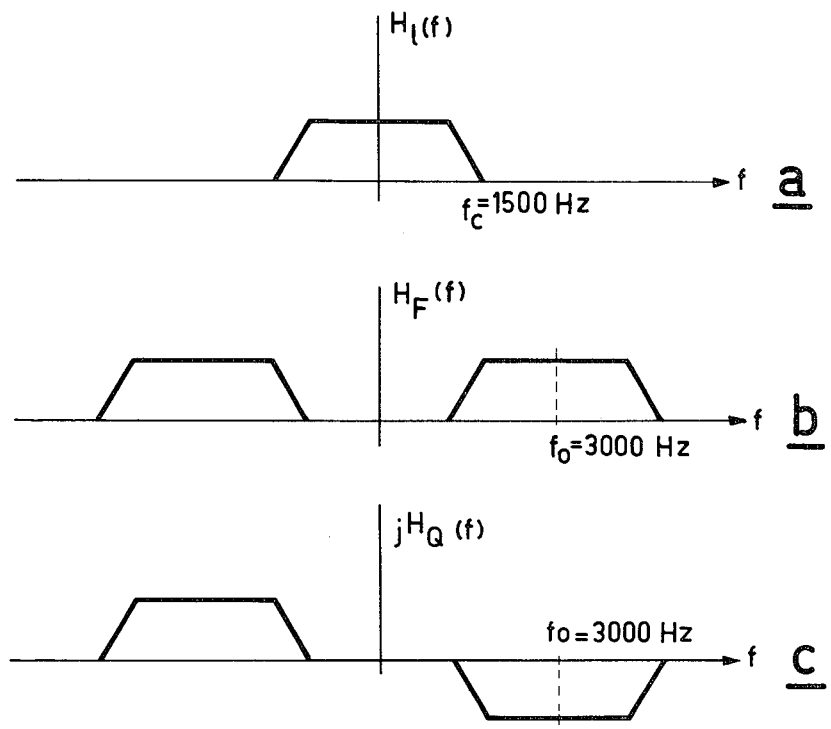
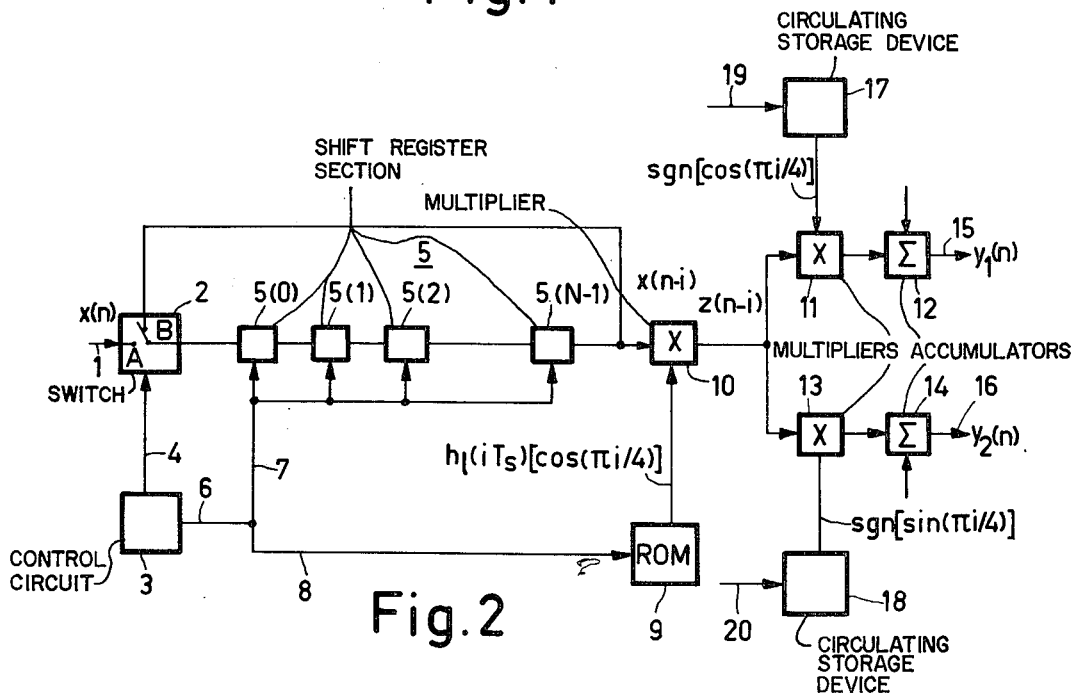

NON-RECURSIVE DISCRETE FILTER

BACKGROUND OF THE INVENTION

1. Field of the Invention

The invention relates to a non-recursive discrete filter for processing input signal samples $x(m)$ in order to generate output signal samples $y(n)$ occurring with a predetermined output sampling frequency $f_s$, which discrete filter has a transfer characteristic with a central frequency $f_o$. The filter transfer characteristic is related to the transfer characteristic of a predetermined lowpass filter having impulse response $h_1(i)$. The discrete filter comprises:
  an input for receiving said input signal samples $x(m)$;
  a first storage means for storing and supplying a given number of input signal samples $x(m)$;
  a second storage means for storing and supplying filter coefficients a(i);
  a multiplying means for multiplying each input signal sample with a corresponding one of said filter coefficients for generating modified input signal samples $z(n,i) = a(i) x(n-i)$
  a first adding means;
  a means for coupling the input of the first adding means to the multiplying means.

2. Description of the Prior Art

A non-recursive discrete filter is an arrangement which is used for producing output signal samples $y(n)$ which are each constituted by the sum of a number (N) of algebraic products which are related to N input signal samples $x(n)$, $y(n)$ and $x(n)$ being related by the expression:

$$y(n) = \sum_{i=0}^{N-1} a(i) \times (n-i) \quad (1)$$

in which $a(i)$ represent constant coefficients which are a function of the transfer characteristic of the desired filter.

Discrete filters can be classified in two groups (see chapter D, reference 1) namely in:

1. Sampled-data-filters. Such filters are adapted to process input signal samples $x(n)$ and to produce output signal samples $y(n)$ which can take on a continuum of values. In such a filter the first storage means for storing and supplying the input signal samples $x(n)$ is, for example, formed by a shift register for non-amplitude discrete signal samples. This shift register may be constructed by means of, for example, "charge coupled devices" (CCD's).

2. Digital filters. The input signal samples $x(n)$ and the output signal samples $y(n)$ occurring in these filters as well as the filter coefficients are amplitude discrete and are available in the form of digital numbers with a given number of bits. The first storage means can again be constituted by a shift register wherein, however, each of the shift register elements is now arranged for storing and supplying a complete digital number $x(n)$. A RAM (random access memory) may also be used as storage means. It should be noted that the way in which these digital numbers are represented (see also reference 1) is of no importance for the present invention.

Besides the two above-mentioned groups of discrete filters a third group also belongs to these discrete filters, namely the binary transversal filters. With these filters the input signal samples are amplitude-discrete but the filter coefficients and the output signal samples can take on a continuum of values (see reference 2).

From the preceding it follows that the expression (1) holds for all of the above-mentioned groups of discrete non-recursive filters. Consequently, the following applies to sampled-data filters, to digital filters as well as to binary transversal filters and the invention will be further explained with reference to a digital filter.

As mentioned above the filter coefficients $a(i)$ are a function of the transfer characteristic of the desired filter. More in particular, for a low-pass filter having an impulse response $h_1(i)$ these filter coefficients are given by the expression:

$$a(i) = h_1(i) \quad (2)$$

As indicated in reference 3, in analog signal processing a bandpass filter having a given center, frequency $f_o$ and a bandwidth which is equal to $2f_c$ can be derived from a lowpass filter having cut-off frequency $f_c$ and impulse response $h_1(\tau)$. If the impulse response of this bandpass filter is represented by $h_F(\tau)$ then it holds that:

$$h_F(\tau) = h_1(\tau) \cos 2\pi f_o t \quad (3)$$

In full agreement herewith, in discrete signal processing a bandpass discrete filter can be derived from a lowpass discrete filter having an impulse response $h_1(i)$ and a bandwidth which is equal to half the bandwidth of the bandpass discrete filter. If $h_F(i)$ represents the impulse response of the bandpass discrete filter then it applies, for example, that:

$$h_F(i) = h_1(i) \cos (2\pi i f_o/f_s) \quad (4)$$

The filter coefficients of this bandpass filter will be indicated by $a_F(i)$ and these coefficients are again given by the relation:

$$a_F(i) = h_F(i) \quad (5)$$

The filter with the impulse response defined in expression (4) will be called an in-phase filter hereinafter.

In, for example, single sideband and vestigial sideband modulation systems (see, for example, references 4 and 5) not only is a filter having the impulse response defined in expression (4) used but also a filter having an impulse response of the form:

$$h_Q(i) = h_1(i)\sin (2\pi i f_o/f_s) \quad (6)$$

The filter coefficients of this filter will be indicated by $a_Q(i)$ and are again given by the expression:

$$a_Q(i) = h_Q(i) \quad (7)$$

The filter having the impulse response defined in expression (6) will be called quadrature filter hereinafter.

Using the discrete in-phase and quadrature filter in said modulation systems results, for example, in the use of two discrete filters which operate fully independently from one another. The in-phase filter makes use of the coefficients $a_F(i)$ and in the quadrature filter of the coefficients $a_Q(i)$. Another possibility is to use a filter which supplies within the sampling period $T_s = 1/f_s$ two output signal samples in succession, wherein the first output signal sample is produced by using the coefficients $a_F(i)$ in expression (1) and wherein the second output signal sample is produced by using the coefficients $a_Q(i)$ in expression (1). In the first solution as well as in the second solution, simultaneously applying the in-phase and quadrature filter requires a storage capacity of such a size that all the coefficients $a_F(i)$ as well as all coefficients $a_Q(i)$ can be stored.

SUMMARY OF THE INVENTION.

It is an object of the invention to provide an arrangement of the type mentioned in the preamble with which the output signal samples of the in-phase filter and of the quadrature filter can be generated simultaneously and wherein the number of multiplications which must be performed for calculating the desired two output signal samples amount to only half the number of multiplications to be performed in the above-mentioned solutions.

The above-mentioned and additional objectives of the invention are realized because, in accordance with the invention said output sampling frequency $f_s$ is related to said center frequency $f_o$ by the expression $f_s = 8f_o$;
said filter coefficients $a(i)$ are given by the expressions $$a(i) = h_1(i) \cdot \tfrac{1}{2}\sqrt{2} \text{ for } i = \text{odd} \quad (8)$$

$$a(i) = h_1(i) - \text{ for } i = \text{even} \quad (9)$$

said coupling means comprise first means for modifying the modified input signal samples $z(n,i)$ with a coefficient sgn $[\cos(\pi i/4)]$ for generating signal samples of the form $z(n,i)$ sgn $[\cos(\pi i/4)]$, said last signal samples being applied to the first adding means for generating first output signal samples $y_1(n)$ of the form:

$$y_1(n) = \sum_{i=0}^{N-1} z(n,i) \cdot \text{sgn}\,[\cos(\pi i/4)] \quad (10)$$

connected to the output of said multiplying means there are second means for modifying the input signal samples $z(n,i)$ with a coefficient *sgn* $[\sin(\pi i/4)]$ for generating signal samples of the form $z(n,i).\text{sgn}\,[\sin(\pi i/4)]$;
second adder means to which the signal samples $z(n,i)$. sgn $[\sin(\pi i/4)]$ are applied for generating second output signal samples $y_2(n)$ of the form:

$$y_2(n) = \sum_{i=0}^{N-1} z(n,i) \cdot \text{sgn}\,[\sin(\pi i/4)] \quad (11)$$

The function *sgn*·[α] is defined as follows:

$$\begin{array}{ll} \text{sgn}\,[\alpha] = -1 & \text{for } \alpha < 0 \\ \text{sgn}\,[\alpha] = 0 & \text{for } \alpha = 0 \\ \text{sgn}\,[\alpha] = +1 & \text{for } \alpha > 0 \end{array} \quad (12)$$

As a result of the special relation which exists between the center frequency $f_o$ and the output sampling frequency $f_s$ the term $\cos(2\pi i f_o/f_s)$ in expression (4) is equal to cos $(\pi i/4)$ which expression can only have the values 0, $\pm 1$, $\pm \tfrac{1}{2}\sqrt{2}$. Likewise, owing to this relation the term $\sin(2\pi i f_o/f_s)$ in expression (6) is equal to $\sin(\pi i/4)$ and consequently can only have the values 0, $\pm 1$, $\pm \tfrac{1}{2}\sqrt{2}$. With in one period $1/f_o$ the terms $\cos(\pi i/4)$ and $\sin(\pi i/4)$ will have the values specified in the following table.

Table 1

| i | cos(πi/4) | sin(π i/4) |
|---|---|---|
| 0 | +1 | 0 |
| 1 | +½ √2 | +½ √2 |
| 2 | 0 | +1 |
| 3 | −½ √2 | +½ √2 |
| 4 | −1 | 0 |
| 5 | −½ √2 | −½ √2 |
| 6 | 0 | −1 |
| 7 | +½ √2 | −½ √2 |
| 8 | +1 | 0 |

If now the term $\cos(\pi i/4)$ is written in the form cos $(\pi i/4) = |\cos(\pi i/4)| \cdot sgn\,[\cos(\pi i/4)]$ and the term sin $(\pi i/4)$ in the form sin $(\pi i/4) = |\sin(\pi i/4)| \cdot sgn\,[\sin(\pi i/4)]$, then it follows from table I that:

$|\cos(\pi i/4)| = |\sin(\pi i/4)|$ for $i = 1, 3, 5, 7$, and that for the remaining values of $i$, namely $i = 0, 2, 4, 6$ that:

$|\cos(\pi i/4)| = 1$ and $|\sin(\pi i/4)| = 0$, or $|\cos(\pi i/4)| = 0$ and $|\sin(\pi i/4)| = 1$.

To realize both filters use can now be made in the first instance of one set of filter coefficients $a(i)$ which comprise a total of N filter coefficients if these filter coefficients are given by the expressions $$a(i) = h_1(i)\,|\cos(\pi i/4)| \text{ for } \cos(\pi i/4) \neq 0 \quad (13)$$

$$a(i) = h_1(i)\,|\sin(\pi i/4)| \text{ for } \cos(\pi i/4) = 0 \quad (14)$$

or vice versa by:

$$a(i) = h_1(i)|\,\sin(\pi i/4)| \text{ for } \sin(\pi i/4) \neq 0 \quad (15)$$

$$a(i) = h_1(i)|\,\cos(\pi i/4)| \text{ for } \sin(\pi i/4) = 0 \quad (16)$$

As table I shows the expressions (13) and (14) or (15) and (16) can be reduced to the expressions (8) and (9).
The filter coefficients $a_F(i)$ and $a_Q(i)$ now satisfy the expressions:

$$a_F(i) = a(i)\,\text{sgn}\,[\cos \pi i/4] \quad (17)$$

$$a_Q(i) = a(i)\,\text{sgn}\,[\sin \pi i/4] \quad (18)$$

As follows from (1) the output signal samples $y_1(n)$ of the in-phase filter are now determined by the expression:

$$y_1(n) = \sum_{i=0}^{N-1} x(n-i) \cdot a(i)\,\text{sgn}\,[\cos \pi i/4] \quad (19)$$

and the output signal samples $y_2(n)$ of the quadrature filter are determined by the expression:

$$y_2(n) = \sum_{i=0}^{N-1} x(n-i) \cdot a(i)\,\text{sgn}[\sin \pi i/4] \quad (20)$$

In these expressions (19) and (20) the values of the filter coefficients are given by (8) and (9).

Both signal samples $y_1(n)$ and $y_2(n)$ can now be derived in a particularly simple manner from one series of signal samples $z(n,i)$ with $i = 0, 1, 2, \ldots N - 1$, each of the signal samples $z(n,i)$ being given by the expression:

$$z(n,i) = x(n-i) \cdot a(i) \quad (21)$$

By modifying the sign of each of the signal samples $z(n,i)$ with $i = 0, 1, 2, \ldots N - 1$ in accordance with the term *sgn* $[\cos(\pi i/4)]$ which is defined in (12) and by adding these modified signal samples the output signal sample $y_1(n)$ is obtained. The output signal sample $y_2(n)$ is determined in an analogous manner.

By applying the measures in accordance with the invention it is accomplished that only N modified filter coefficients need to be stored. Compared with the two abovedescribed solutions for realizing an in-phase filter and a quadrature filter a reduction in the required hardware is obtained on the one hand and, on the other hand, the plurality of multiplications to be performed is reduced, which results in a reduction in the internal processing speed. More in particular, a storage capacity of N filter coefficients can by saved and the number of multiplications to be performed amounts to only N per two output signal samples $y_1(n)$ and $y_2(n)$. For, processing the functions $z(n,i) \cdot sgn \; [\cos(\pi \; i/4)]$ and $z(n,i) \cdot sgn \; [\cos(\pi \; i/4)]$ the only functional requirement is a simple apparatus for deciding whether or not to change the sign of $z(n,i)$, or whether or not to apply $z(n,i)$ to the adding means.

BRIEF DESCRIPTION OF THE FIGURES

FIG. 1 shows a lowpass transfer characteristic and the in-phase and in quadrature therewith, bandpass transfer characteristic derived therefrom.

FIG. 2 shows an embodiment of the discrete filter in accordance with the invention.

(References)

Figure 3:
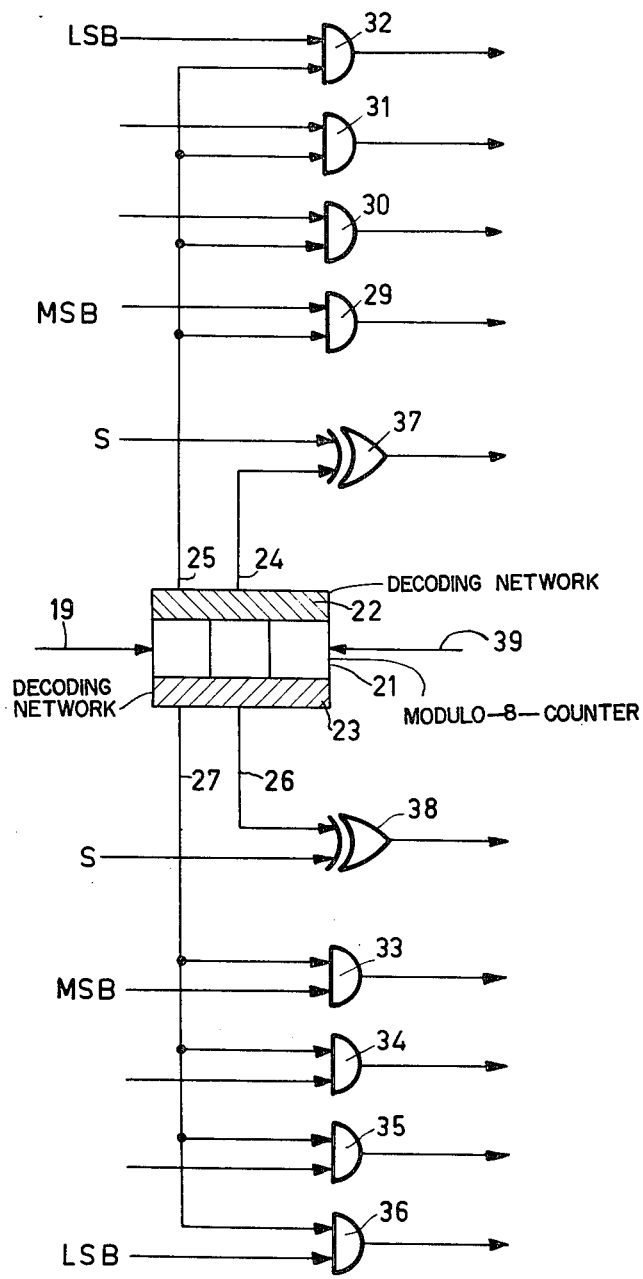
FIG. 3 shows an embodiment of the means for modifying the modified input signal samples.

1. Terminology in Digital Signal Processing; L.R. Rabiner; IEEE Transactions on Audio and Electroacoustics, Vol. AU-20, No. 5, December 1972, pages 322-337.
2. Filter for bivalent pulse signals; U.S. Pat. 3,500,215, issued Mar. 10, 1970.
3. The Fourier Integral and its Applications; A. Papoulis McGraw-Hill Book Company Inc. 1962.
4. Arrangement for frequency transposition of analog signals; Dutch patent application No. 7101037.
5. Filter and Demodulation Arrangement; Dutch Pat. application No. 7605726.
6. Transverse Digital Filter; J.W. Elliot; American Pat. No. 3,639,848.
7. Digital filter arrangement for processing binary coded signal samples; U.S. Pat. No. 3,988,606, issued Oct. 26, 1976.
8. Non-recursive digital filter with reduced output sampling frequency; U.S. application Ser. No. 631,834, filed Nov. 12, 1975 abandoned in favor of U.S. application Ser. No. 767,548, filed Feb. 10, 1977.
9. Theory and Applicaton of Digital Signal Processing; L. R. Rabiner, B. Gold, Prentice-Hall, Inc.; 1975.

DESCRIPTION OF THE EMBODIMENTS

The in-phase and quadrature filter

Shown at $a$ in FIG. 1 is the transfer function $H_1(f)$ of a lowpass filter for analog signals. This filter has a cut-off frequency $f_c = 1500$ Hz. In accordance with the preceding the impulse response of this filter is $h_1(t)$. The transfer function of the in-phase filter which can be derived from this lowpass filter is shown at $b$ in FIG. 1. The center frequency $f_o$ of this in-phase fiter has been chosen to be equal to 3000 Hz. The impulse response $h_F(t)$ of this filter is given by (3) and the transfer function $h_F(f)$ is given by (see reference 3) $H_F(f) = \frac{1}{2} H_1(f+f_o) + \frac{1}{2} H_1(f-f_o)$. The transfer functon of the quadrature filter of the in-phase filter which can also be derived from the lowpass filter shown at $a$ in FIG. 1 and which has the same center frequency $f_o = 3000$ Hz as the in-phase fiter is shown at $c$ in FIG. 1. The impulse response $h_Q(t)$ of this quadrature filter is given by $H_Q(t) = H_1(t) \sin 2\pi f_o t$ and its transfer function $H_Q(f)$ by (see reference 3) $H_Q(f) = \frac{1}{2} j [H_1(f+f_o) - H_1(f-f_o)]$.

The above relation between $H_1(f)$, $H_F(f)$ and $H_Q(f)$ also applies to the transfer function of an in-phase discrete filter and a quadrature discrete filter. More in particular it applies to the transfer function $H'_1(f)$ of a discrete lowpass filter which is derived from the lowpass filter having the transfer function given at $a$ in FIG. 1 and given by:

$$H'_1(f) = \sum_{n=-\infty}^{\infty} H_1(f - nf_s) \quad (22)$$

So for $n = 0$ this transfer functon is identical to that of the above-mentioned lowpass filter for analog signals. In (22) $f_s$ again represents the output sampling frequency of a discrete filter.

In a similar manner it applies to the transfer functions $H'_F(f)$ and $H'_Q(f)$ of the in-phase and quadrature discrete filter respectively:

$$H'_F(f) = \sum_{n=-\infty}^{\infty} H_F(f - nf_s) \quad (23)$$

$$H'_Q(f) = \sum_{n=-\infty}^{\infty} H_Q(f - nf_s) \quad (24)$$

The discrete filter

FIG. 2 shows a discrete filter in the form of a digital filter. In accordance with the invention this filter is arranged for simultaneously realizing the transfer functions given in the expressions (23) and (24) (see also at $b$ and $c$ in FIG. 1). This digital filter comprises an input 1 to which multi-bit code words $x(n)$ are applied with a frequency which is equal to the output sampling frequency $f_s$. In this embodiment $f_s = 8f_o = 24$ kHz. This digital filter is partly constructed in the same manner as the digital filter described in reference 6. So this filter comprises a switch 2, shown symbolically only, which is controlled by a control circuit 3 through a lead 4. When this switch 2 is in position A under the control of a control signal the input code words $x(n)$ are successively transferred to a storage device 5. This storage device is constructed as a shift register having N shift register sections $5(0), \ldots 5(N-1)$, which are each arranged for storing a code word $x(n)$. At the beginning of the calculation of the output signal samples $y_1(n)$ and $y_2(n)$ the shift register sections $5(0), \ldots 5(N-1)$ comprise the code words $x(n), x(n-1), x(n-2), \ldots x(n-N+1)$ respectively.

For performing the operations defined in expression (1) the switch 2 is adjusted to the position B as a result of a control signal originating from the control circuit 3. In this position the shift register 5 is uncoupled from the input 1 and the last shift register section $5(N-1)$ is connected to the first shift register section $5(0)$, a circulating shift register being obtained in this manner. The control circuit 3 now supplies clock pulses at its output 6. Via a lead 7 these clock pulses are applied to the circulating shift register and, via a lead 8 to a storage device 9, (for example a ROM) wherein the fiter coefficients $a(i)$ defined in the expressions (8) and (9) are stored. In response to each clock pulse a filter coefficient $a(i)$ and the associated code word $x(n-i)$, which is stored in the last shift register section $5(n-1)$ are applied to a multiplier 10. Consequently this multiplier 10 produces the products $z(n,i) = a(i)x(n-i)$. Thereafter these products $z(n \cdot i)$ are applied on the one hand to an accumulator 12 through a multiplier 11 and on the other hand to an accumulator 14 through a multiplier 13. These accumulators are reset to zero at the instant the switch 2 is in the position A.

After all products of each of the code words $x(n)$ stored in the shift register 5 and the associated filter coefficients $a(i)$ have been formed and have, thereafter, been applied to the accumulators 12 and 14 through the multipliers 11 and 13 the control circuit 3 produces a signal which causes the sums in the two accumulators 12 and 14 which represent the digital output code words $y_1(n)$ and $y_2(n)$ (see expression (10) and (11)) to be produced at the outputs 15 and 16 of the filter.

Besides the sequentially occurring products $z(n,i)$ the factors $sgn [\cos(\pi i/4)]$ and $sgn [\sin(\pi i/4)]$ respectively are applied to the multipliers 11 and 13. As a result the multiplier 11 supplies the products $z(n,i) \cdot sgn [\cos(\pi i/4)]$ and the multiplier 13 supplies the products $z(n,i) \cdot sgn [\sin(\pi i/4)]$. These products are applied to the accumulators 12 and 14 respectively which, consequently, produce the output code words $y_1(n)$ and $y_2(n)$ defined in expressions (10) and (11).

The factors $sgn [\cos(\pi i/4)]$ and $sgn [\sin(\pi i/4)]$ are stored in circulating storage devices 17 and 18 respectively. The clock pulses which are produced at the output 6 of the control circuit 3 are applied to these circulating storage devices, also via the leads 19 and 20 respectively. In response to each of these clock pulses the factor $sgn [\cos(\pi i/4)]$, associated with the product $z(n,i)$ and stored in the storage device 17 and the factor $sgn [\sin(\pi i/4)]$ by stored in the storage device 18 are applied to the multipliers 11 and 13 respectively.

Table II specifies the values of the filter coefficients $a(i)$ which are successively applied, within an output sampling period $T_s$ to the multiplier 10 and the factors $sgn [\cos(\pi i/4)]$ and $sgn [\sin(\pi i/4)]$ respectively which are applied simultaneously to the multipliers 11 and 13. Each sampling period $T_s$ starts with the values which belong to $i=0$. More in particular it is assumed herewith that N is equal to 12. The filter coefficients of the equivalent lowpass fiter are $h_1(i)$.

Table II

| i | | sgn[cos($\pi$ i/4)] | sgn[sin($\pi$ i/4)] |
|---|---|---|---|
| 0 | $h_1(0)$ | +1 | 0 |
| 1 | ½ √2 · $h_1(1)$ | +1 | +1 |
| 2 | $h_1(2)$ | 0 | +1 |
| 3 | ½ √2 · $h_1(3)$ | −1 | +1 |
| 4 | $h_1(4)$ | −1 | 0 |
| 5 | ½ √2 · $h_1(5)$ | −1 | −1 |
| 6 | $h_1(6)$ | 0 | −1 |
| 7 | ½ √2 · $h_1(7)$ | +1 | −1 |
| 8 | $h_1(8)$ | +1 | 0 |
| 9 | ½ √2 · $h_1(9)$ | +1 | +1 |
| 10 | $h_1(10)$ | 0 | +1 |
| 11 | ½ √2 · $h_1(11)$ | −1 | +1 |

As the additional multiplying factor ½ √2 shown in Table II is combined with the original fiter coefficients the factors which are applied to the multipliers 11 and 13 have the values −1, 0 or +1 exclusively. Consequently, these multipliers can be constructed in a particularly simple manner while the storage devices 17 and 18 can be replaced by a single modulo-8-counter.

FIG. 3 shows an embodiment of the circuit which is formed by the components 11, 13, 17 and 18 of FIG. 2.

Herein it is assumed that each of the products $z(n,i)$ occurs in bit-parallel form at the output of the multiplier 10 and is given in sign and mangitude representation (see reference 1). More in particular it is assumed that these products consist of a sign-bit and four magnitude-bits. Herein the sign-bit of a positive number is represented by the bit symbol "1" and the sign-bit of a negative number by the bit-symbol "0".

The circuit shown in FIG. 3 comprises a modulo-8-counter 21 to which the clock pulses occuring at the output 6 of the control circuit 3 are applied as counting pulses through lead 19. A decoding network 22 and a decoding network 23 are connected to this counter 21. The decoding network 22 has two outputs, namely 24 and 25 and the decoding network 23 has the two outputs 26 and 27. Depending on the counting position of counter 21 voltages which are representative of the bit symbol "1" or "0" are produced at the outputs 24–27 of the decoding networks 22 and 23. The relation between the various counting positions of counter 21 and the bit symbols produced at the output 24–27 is shown in Table III.

Table III

| counting pos. counter 21 | output | | | |
|---|---|---|---|---|
| | 24 | 25 | 26 | 27 |
| 000 | 0 | 1 | 0 | 0 |
| 001 | 0 | 1 | 0 | 1 |
| 010 | 0 | 0 | 0 | 1 |
| 011 | 1 | 1 | 0 | 1 |
| 100 | 1 | 1 | 0 | 0 |
| 101 | 1 | 1 | 1 | 1 |
| 110 | 0 | 0 | 1 | 1 |
| 111 | 0 | 1 | 1 | 1 |

In addition, the circuit shown in FIG. 3 comprises eight AND-gates 29–36 as well as two modulo-2-counters 37 and 38 (exclusive OR-gates). The AND-gates 29–36 and the modulo-2-counters 37 and 38 are connected in the manner shown in the Figure to the outputs 24–27 of the decoding networks 22 and 23. Consequently, these AND-gates 29–36 are controlled by the bit symbols which are produced at the outputs 25 and 27. More in particular an AND-gate is blocked when the relevant bit symbol is an "0." If the relevant bit symbol is a "1" then this AND-gate is opened. Besides the bit symbol which occurs at the output 24 and 27 respectively the sign-bit of the output code words $z(n,i)$ of the multiplier 10 is applied to the modulo-2-counters 37 and 38. The magnitude bits of this output code word $z(n,i)$ are applied to the AND-gates 29–32 and 33–36 with the understanding that the most significant magnitude bit is applied to the AND-gates 29 and 33, the next magnitude bit to the AND-gates 30 and 34, and so on.

That portion of the circuit of FIG. 3 which is constituted by the counter 21, the decoding network 22, the AND-gates 29–32 and the modulo-2-counter 37 is now equivalent to the circuit which is formed by the components 11 and 17 in FIG. 2. The circuit which in FIG. 2 is formed by the components 13 and 18 is equivalent to that portion of the circuit of FIG. 3 which is constituted by the counters 21, the decoding network 23, and the AND-gates 33–36 and the modulo-2-counter 38.

The circuit shown in FIG. 3 operates as follows. If the output 24 supplies a "0"— then the output code word of the multiplier 10 is fed unchanged to the accumulator 12. This implies a multiplication of $z(n,i)$ by a factor +1. If the output 21 supplies a "1" then the sign bit of $z(n,i)$ is inverted. This implies an amplification by a factor −1. If, finally, an "0" is produced at the output 25 then all AND-gates 29–32 are blocked. This implies a multiplication of $z(n,i)$ by a factor zero. The circuit which is constituted by the counter 21, the decoding network 23, the AND-gates 33–36 and the modulo-2-counter 38 and which is arranged for multiplying $z(n,i)$ by a factor $sgn$ $[\sin(\pi i/4)]$ operates in the same manner so that a detailed description thereof is superfluous.

Simultaneously with resetting the accumulators 12 and 14 to the zero position and the moment that the switch 2 is in the position A the modulo-8-counter is reset to the zero positon for which purpose the control circuit 3 supplies a signal which is applied via the lead 39 to the counter 21.

In this embodiment the control circuit 3 may be constructed in the manner as described in reference 6.

It should be noted that as storage device for the input code words $x(n)$ a RAM may, for example, be utilized instead of a circulating shift register in the manner as, for example, described in reference 7.

In the embodiment shown in FIG. 2 it is assumed that the input sampling frequency is equal to the output sampling frequency $f_s$. In case, however, the input sampling frequency exceeds for example the output sampling frequency $f_s$ buffer may be included at the input of the filter, for example in a manner as described in reference (8).

finally, the discrete filter in accordance with the invention may be constructed as a transversal filter (see reference 1) instead of in the manner shown in FIG. 2).

What is claimed is:

1. A non-recursive discrete filter for processing input signal samples $x(m)$ to generate output signal samples $y(n)$ occurring at a predetermined output sampling frequency $f_s$, said discrete filter having a transfer characteristic with a center frequency $f_o$, where $f_s = 8f_o$, said transfer characteristic being related to the transfer characteristic of a predetermined lowpass filter with an impulse response $h_1(i)$, said discrete filter comprising input means for receiving said input signal samples $x(m)$;

first storage means for storing and supplying a given number of input signal samples $x(m)$;

second storage means for storing and supplying filter coefficients $a(i)$, where:

$a(i) = h_1(i) \cdot \frac{1}{2} \sqrt{2}$      for $i$ = odd
$a(i) = h_1(i)$      for $i$ = even;

first multiplying means for modifying each input signal sample from said first storage means by a corresponding filter coefficient from said second storage means to generate modified input signal samples $z(n,i) = a(i)x(n-i)$;

second multiplying means for modifying the modified signal samples $z(n,i)$ from said first multiplying means by a coefficient $sgn\{\cos(\pi i/4)\}$ to generate signal samples of the form $z(n,i)$ $sgn\{\cos(\pi i/4)\}$;

third multiplying means for modifying the modified signal sampls $z(n,i)$ from said first multiplying means by a coefficient $sgn\{\sin(\pi i/4)\}$ to generate signal samples of the form $z(n,i)$ $sgn\{\sin(\pi i/4)\}$;

first summing means connected to the output of said second multiplying means for generating output signal samples of the form $$y_1(n) = \sum_{i=0}^{N-1} z(n,i)sgn\{\cos(\pi i/4)\};$$

and second summing means connected to the output of said third multiplying means for generating output signal samples of the form $$y_2(n) = \sum_{i=0}^{N-1} z(n,i)sgn\{\sin(\pi i/4)\}.$$

* * * * *